US008114725B1

(12) United States Patent
Huang et al.

(10) Patent No.: US 8,114,725 B1

(45) Date of Patent: Feb. 14, 2012

(54) METHOD OF MANUFACTURING MOS DEVICE HAVING LIGHTLY DOPED DRAIN STRUCTURE

(75) Inventors: Tsung-Yi Huang, Hsinchu (TW); Ching-Yao Yang, Changhua (TW)

(73) Assignee: Richtek Technology Corporation (TW)

( * ) Notice: Subject to any disclaimer, the term of this patent is extended or adjusted under 35 U.S.C. 154(b) by 0 days.

(21) Appl. No.: 12/914,291

(22) Filed: Oct. 28, 2010

(51) Int. Cl.
*H01L 21/338* (2006.01)
*H01L 21/336* (2006.01)

(52) U.S. Cl. ......................... 438/184; 438/185; 438/297

(58) Field of Classification Search .................. 438/184, 438/185, 297; 257/E21.09
See application file for complete search history.

(56) References Cited

U.S. PATENT DOCUMENTS

| | | | | |
|---|---|---|---|---|
| 5,966,604 | A | 10/1999 | Lin | |
| 6,337,262 | B1 * | 1/2002 | Pradeep et al. | 438/574 |
| 2002/0068395 | A1 * | 6/2002 | Tran et al. | 438/194 |
| 2003/0008484 | A1 * | 1/2003 | Hook | 438/524 |
| 2006/0187709 | A1 * | 8/2006 | Ogura et al. | 365/185.03 |
| 2008/0067589 | A1 * | 3/2008 | Ito et al. | 257/344 |

* cited by examiner

*Primary Examiner* — William M. Brewster

(74) *Attorney, Agent, or Firm* — Tung & Associates

(57) ABSTRACT

The present invention discloses a method of manufacturing MOS device having a lightly doped drain (LDD) structure. The method includes: providing a first conductive type substrate; forming an isolation region in the substrate to define a device area; forming a gate structure in the device area, the gate structure having a dielectric layer, a stack layer, and a spacer layer on the sidewalls of the stack layer; implanting second conductive type impurities into the substrate with a tilt angle to form an LDD structure, wherein at least some of the impurities are implanted into the substrate through the spacer to form part of the LDD structure below the spacer layer; and implanting second conductive type impurities into the substrate to form source and drain.

9 Claims, 4 Drawing Sheets

14a

METHOD OF MANUFACTURING MOS DEVICE HAVING LIGHTLY DOPED DRAIN STRUCTURE

BACKGROUND OF THE INVENTION

1. Field of Invention

The present invention relates to a method of manufacturing a metal oxide semiconductor (MOS) device; particularly, it relates to a method of manufacturing a MOS device having a lightly doped drain (LDD) structure.

2. Description of Related Art

FIGS. 1A-1E are cross-section views showing a manufacturing process of a conventional MOS device having an LDD structure. As shown in FIG. 1A, isolation regions 12 are formed in a substrate 11 to define a device area 100. The isolation regions 12 for example are formed by local oxidation of silicon (LOCOS), and the substrate 11 for example is a P-type silicon substrate. Next, as shown in FIG. 1B, a dielectric layer 13*a* and a stack layer 13*b* of a gate structure is formed in the device area 100. Then, as shown in FIG. 1C, LDD structures 14 are formed by implantation which implants N-type impurities, in the form of accelerated ions as indicated by the dash arrow lines in the figure, to the substrate 11 masked by a photo mask, the isolation regions 12, and the stack layer 13*b*. And then, a spacer layer 13C is formed on the sidewall of the dielectric layer 13*a* and the stack layer 13*b* as shown in FIG. 1D. The material of the spacers 13C for example may be silicon dioxide, silicon nitride, or a combination of the above. In the following process step, as shown in FIG. 1E, source and drain 15 are formed by implantation which implants N-type impurities, in the form of accelerated ions as indicated by the dash arrow lines in the figure, to the substrate 11. The regions beneath the spacers 13*c* will not be implanted because they are masked by the spacers 13*c*. The concentration of the N-type impurities of the source and drain 15 is in the order of $10^{15}$~$10^{16}$/cm$^2$, and the concentration of the N-type impurities of the LDD structure 14 is in the order of $10^{12}$~$10^{13}$/cm$^2$.

The MOS device provided with the LDD structures has a gradient of N-type impurities which can reduce the electric field in the device area 100 to mitigate the hot carrier effect.

The aforementioned prior art needs two photo masks and photolithography steps, to form the LDD structures 14 and the source and drain 15 respectively. Thus, the manufacturing cost is high. Besides, due to process steps between the two photolithography steps and implantation steps, such as deposition, etching, and thermal steps, etc. for forming the spacer 13*c*, it is hard to control the distribution of the doped impurities of the LDD structures 14 after thermal diffusion. In this regard, U.S. Pat. No. 5,966,604 discloses a method of manufacturing a MOS device having LDD structures, which moves the process steps for forming the LDD structures 14 and the source and drain 15 before the formation of the spacers 13*c*. However, this reduces the thermal budget, and because the concentration of the LDD structures 14 is adjusted by counter doping P-type impurities, the behavior of the impurities in the device is more complicated and less controllable.

In both the aforementioned prior art methods, the impurities are implanted to the substrate to form a gradient profile with only two different depths, which is less preferred. Another disadvantage is that, as the technology trend requires even smaller device dimension, and even shallower depths of the LDD structure 14, the source and drain 15, the implantation steps are performed by even lower energies, and thus it becomes harder to control the depths, concentrations, etc. of the impurities. Implantation by low energy is less accurate.

In view of the foregoing, the present invention provides a method of manufacturing a MOS device having an LDD structure. This method not only saves photo masks and improves the thermal budget, but also improves the distribution gradient of the impurities to further mitigate the hot carrier effect and to improve the accuracy of low energy ion implantation.

SUMMARY OF THE INVENTION

The objective of the present invention is to provide a method of manufacturing a MOS device having an LDD structure. This method not only saves photo masks and improves the thermal budget, but also improves the distribution gradient of the impurities to further mitigate the hot carrier effect and to improve the accuracy of low energy ion implantation.

To achieve the objective mentioned above, the present invention provides a method of manufacturing a MOS device having an LDD structure, comprising: providing a first conductive type substrate; forming isolation regions in the substrate to define a device area; forming a gate structure in the device area, the gate structure having a dielectric layer, a stack layer, and a spacer layer on sidewalls of the stack layer; implanting second conductive type impurities into the substrate with a tilt angle to form an LDD structure, wherein at least some of the impurities are implanted into the substrate through the spacer to form part of the LDD structure below the spacer layer; and implanting second conductive type impurities into the substrate to form source and drain.

In a preferred embodiment, the first conductive type is P-type and the second conductive type is N-type. And in another preferred embodiment, the first conductive type is N-type and the second conductive type is P-type.

In a preferred embodiment, the isolation regions are formed by LOCOS or shallow trench isolation (STI).

In a preferred embodiment, the tilt angle is between 30 degree and 90 degree.

The aforementioned method of manufacturing a MOS device having an LDD structure preferably further comprises: rotating the substrate with a rotation angle on a horizontal plane, and implanting second conductive type impurities into the substrate with the tilt angle or another tilt angle to form another LDD structure symmetric to said LDD structure with respect to the gate structure, wherein at least some of the impurities implanted in this step are implanted into the substrate through the spacer to form another part of the LDD structure below the spacer layer.

In the aforementioned method, preferably, the rotation angle is 90 degree, 180 degree, or 270 degree.

In one embodiment, the regions implanted by the step of forming the LDD structure and the step of forming the source and drain are defined by a same mask.

In another embodiment, the step of forming the LDD structure and the step of forming the source and drain are blanket implantations using the gate structure and the isolation regions as masks.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, but not drawn according to actual scale.

Figure 1A:
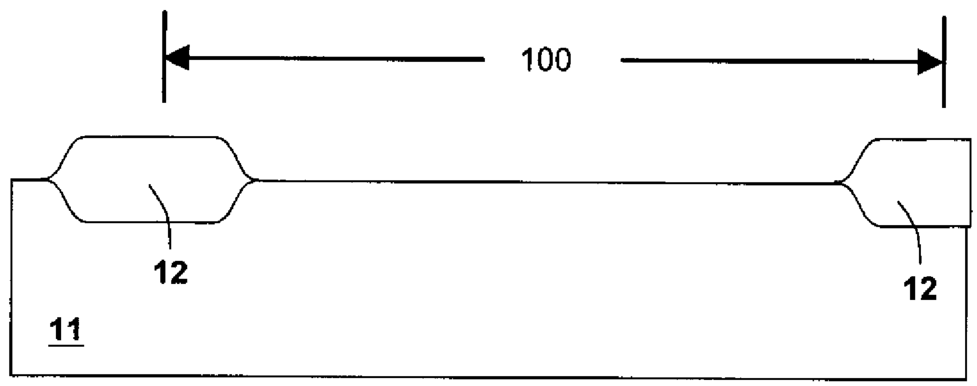
FIGS. 1A-1E show a conventional manufacturing process of a MOS device having an LDD structure.
Figure 1B:
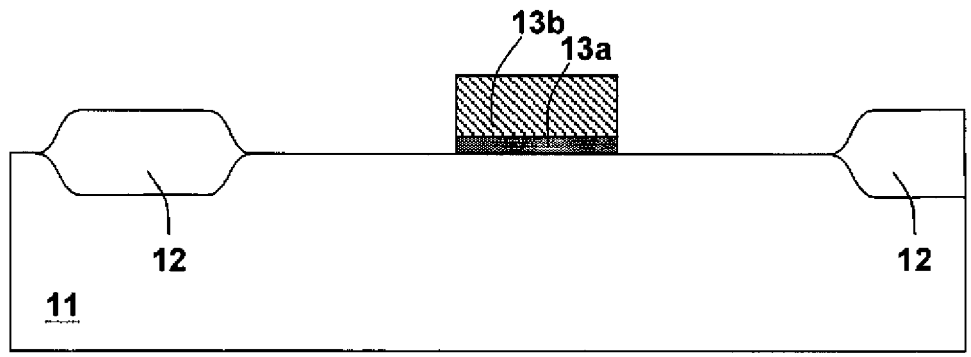
Figure 1C:
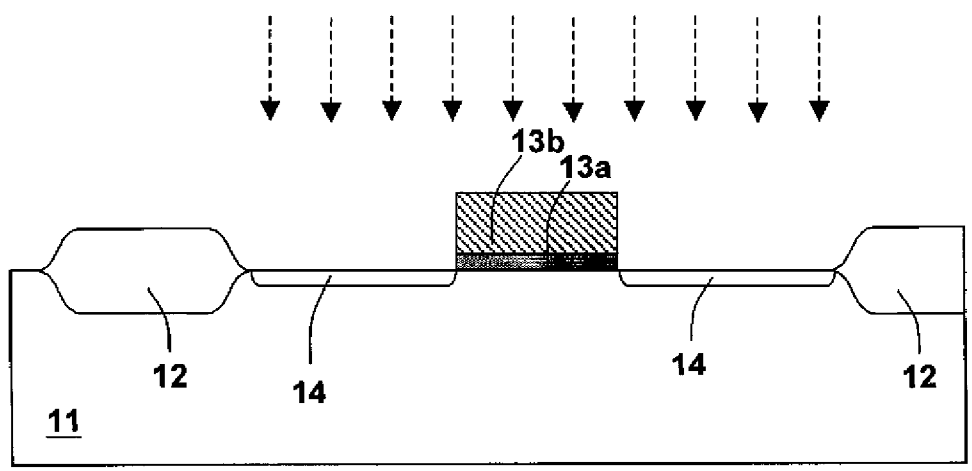
Figure 1D:
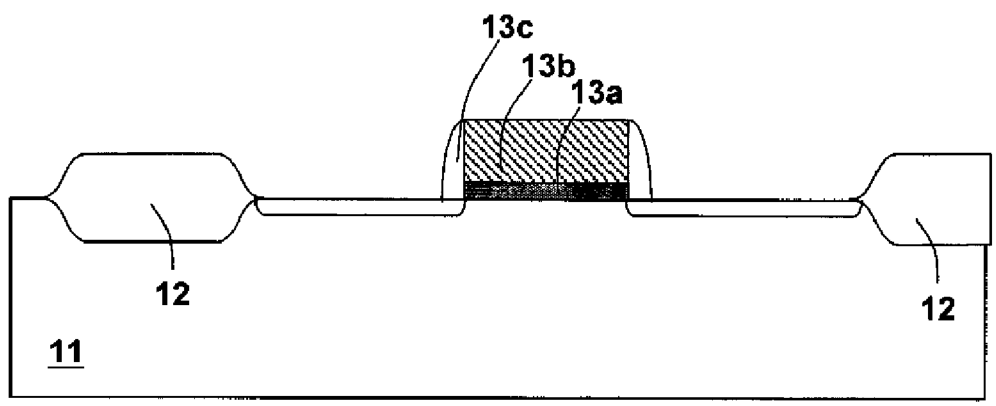
Figure 1E:
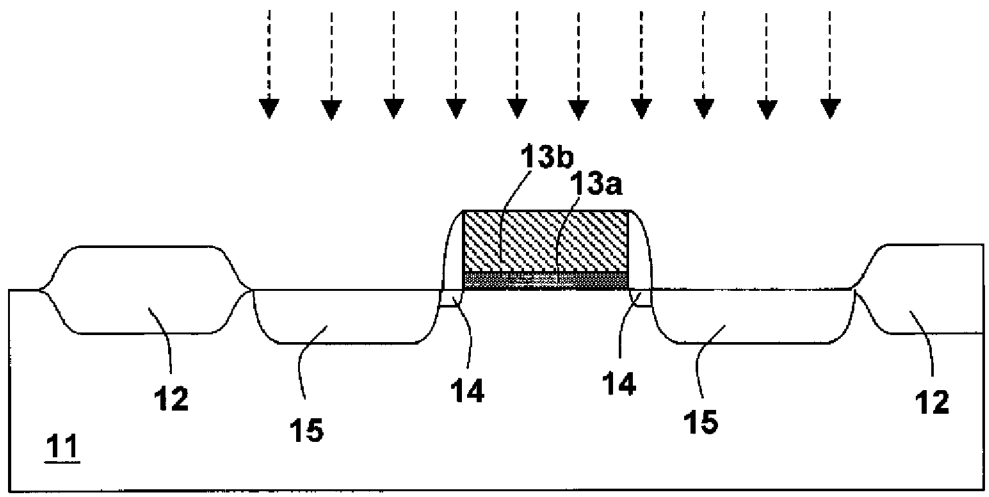
Figure 2A:
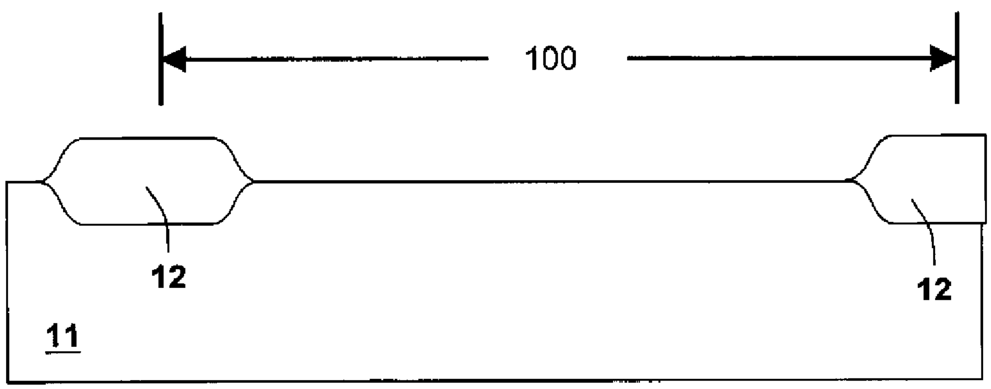
FIGS. 2A-2E show cross-section views of a first embodiment of the present invention.
Figure 2B:
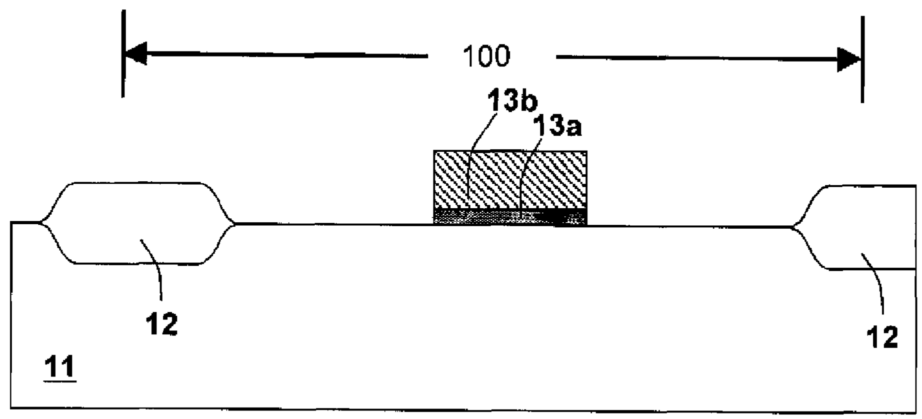
Figure 2C:
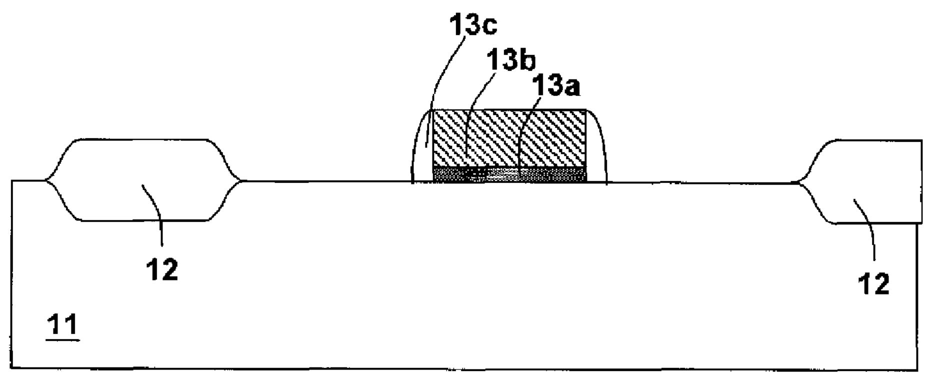

FIGS. 2A-2E are cross-section views showing a manufacturing process of an embodiment of the present invention. This embodiment is a method of manufacturing a MOS device having an LDD structure 14. As shown in FIG. 2A, first, the substrate 11, for example but not limited to a P-type or an N-type silicon substrate 11, is provided. Next, the isolation regions 12 are formed in the substrate 11 to define the device area 100. As shown in the figure, the device area 100 is located between the isolation regions 12. The isolation regions 12 are formed by LOCOS or STI, shown to be LOCOS in this embodiment as an example. Next, as shown in FIG. 2B, a part of the gate structure, including the dielectric layer 13*a* and the stack layer 13*b*, is formed in the device area 100. Different from the prior art, the LDD structure 14 and/or the source and drain 15 is not formed next; instead, as shown in FIG. 2C, the spacer 13*c* of the gate structure is formed. The gate structure can be made of various materials and can be formed by various ways, as well known by those skilled in the art. The details thereof are omitted here.

Figure 2D:
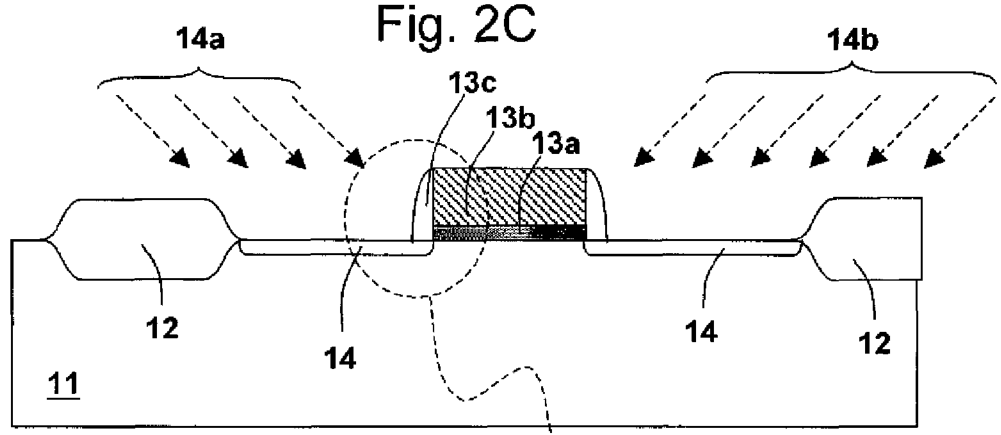
Figure 2D:
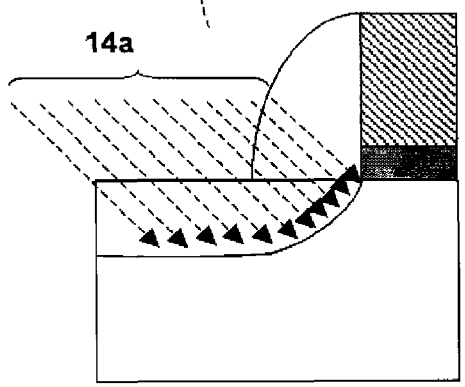

Next, as shown in FIG. 2D, the LDD structures 14 are formed by implantation which implants impurities, such as P-type or N-type impurities, in the form of accelerated ions with a tilt angle as indicated by the dash arrow lines in the figure, to the substrate 11. Note that when the substrate 11 is N-type, the impurities are P-type; and if the substrate 11 is P-type, the impurities are N-type. A photo mask is not required in this implantation step, but it certainly can be used if desired. With the isolation regions 12, the gate structure, and/or the photo mask as the masks covering regions outside the LDD structures 14, impurities are implanted to form the LDD structures 14. The impurities are implanted into the substrate with a tilt angle which is preferably between 30 degree and 90 degree. Some of the accelerated ions will strike the spacer 13*c*, and because of diversities among the ions in acceleration, tilt angles, thickness of the spacer 13*c* where the ions strike, and other factors such as the species of the ions and the material of the spacer 13*c*, some of the ions will penetrate through the spacer 13*c* to reach different depths beneath the spacer 13*c*, as shown by the lower part of FIG. 2D. As shown in the lower drawing, the more inner and closer to the inside of the MOS device channel, the shallower the impurities are. This gradient profile helps to further mitigate the hot carrier effect. Moreover, because the accelerated ions need to pass through the spacer 13*c*, it requires a higher energy to accelerate the ions. Therefore, for a MOS device with shallow LDD structures 14, it is easier to control the implantation because higher energy is used.

After implanting impurities with a tilt angle as indicated by the dash arrow lines 14*a*, it is preferable to rotate the substrate 11 with a rotation angle on the horizontal plane, such as 90 degree, 180 degree, 270 degree, or two or more of above angles, and to implant impurities into the substrate 11 with the tilt angle between 30 degree and 90 degree, as indicated by the dash arrow lines 14*b* in the figure, to form another LDD structure 14 symmetric to the previously formed LDD structure 14 with respect to the gate structure. Similarly, some of the accelerated ions will strike and penetrate through the spacer 13*c* into the substrate 11 and form a shallower gradient profile.

Figure 2E:
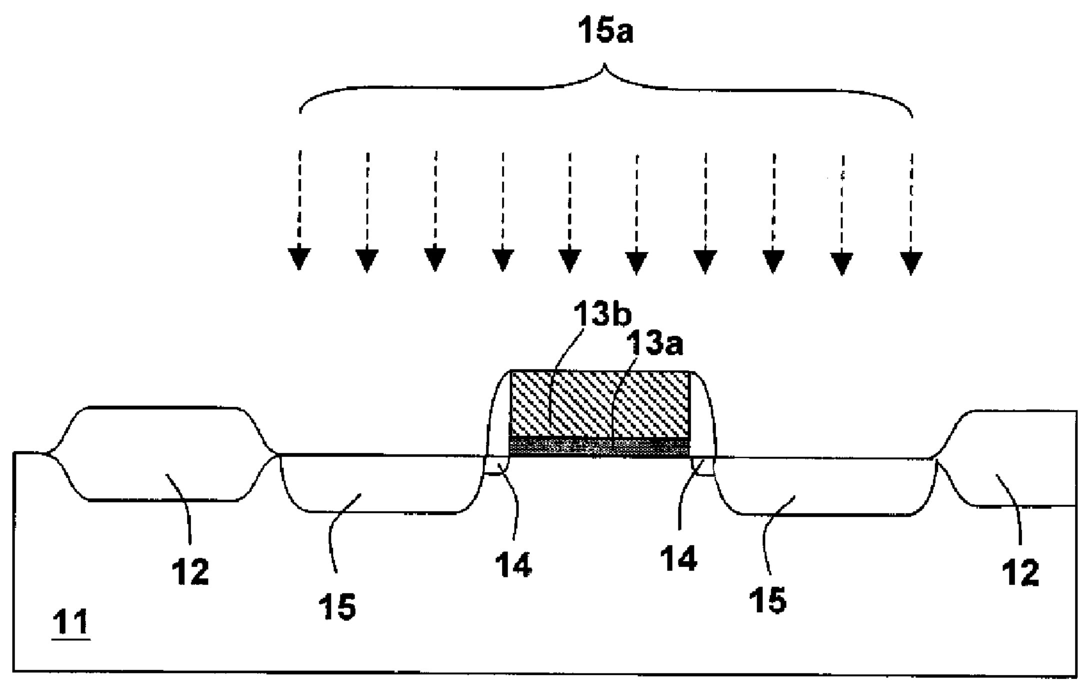

In the next step, as shown in FIG. 2E, the source and drain 15 are formed by implantation which implants impurities, such as P-type or N-type impurities, in the form of accelerated ions as indicated by the dash arrow lines 15*a* in the figure, to the substrate 11. The impurities are not implanted to the substrate 11 beneath the spacer 13*c*; thus, the impurities of the LDD structures 14 and the source and drain 15 close to the MOS device channel present a gradient profile with different densities at different depths, to further mitigate the hot carrier effect. The regions implanted by the step of forming the LDD structures 14 and the step of forming the source and drain 15 may be defined by one same mask, or, these two steps may be blanket implantations using the gate structure and the isolation regions 12 as masks. As such, the present invention can save the cost of photo masks as compared to the prior art. This is another advantage of the present invention.

Figure 2F:
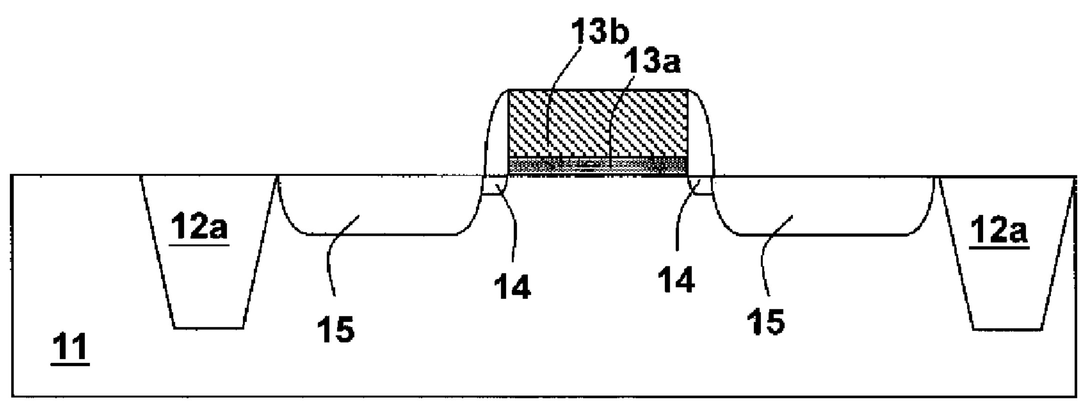
FIG. 2F shows a cross-section view of a second embodiment of the present invention.

FIG. 2F shows a second embodiment of the present invention. This embodiment shows that the isolation regions 12 may be formed by STI.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the rotation angle mentioned in the present invention, such as 90 degree, 180 degree, or 270 degree, should not be interpreted as an exact number of the rotation angle that no tolerance is allowed; instead, there should be allowed some deviation. For another example, other process steps or structures which do not affect the primary characteristics of the device, such as a deep well, etc., can be added. For another example, the photolithography step described in the above can be replaced by electron beam lithography, X-ray lithography, etc. In view of the foregoing, the spirit of the present invention should cover all such and other modifications and variations, which should be interpreted to fall within the scope of the following claims and their equivalents.

What is claimed is:

1. A method of manufacturing a MOS device having a lightly doped drain (LDD) structure, comprising:

providing a first conductive type substrate;

forming isolation regions in the substrate to define a device area;

forming a gate structure in the device area, the gate structure having a dielectric layer, a stack layer, and subsequently forming a spacer layer on sidewalls of the stack layer;

after forming the spacer layer on the sidewalls of the stack layer, implanting second conductive type impurities into the substrate with a tilt angle to form an LDD structure, wherein at least some of the impurities are implanted into the substrate through the spacer to form part of the LDD structure below the spacer layer, and the impurities are distributed with a trapezoid shape and a gradient concentration extending fully under the spacer from cross-section view, wherein the LDD structure does not exist before forming the spacer layer on sidewalls of the stack layer and no other spacer is formed after the LDD structure is formed; and implanting second conductive type impurities into the substrate to form source and drain, wherein the implanting steps to form the LDD structure and the source and drain are performed sequentially without any deposition step in between.

2. The method of claim 1, wherein the first conductive type is P-type and the second conductive type is N-type.

3. The method of claim 1, wherein the first conductive type is N-type and the second conductive type is P-type.

4. The method of claim 1, wherein the isolation regions are formed by local oxidation of silicon or shallow trench isolation.

5. The method of claim 1, wherein the tilt angle is between 30 degree and 90 degree.

6. The method of claim 1, further comprising:

rotating the substrate with a rotation angle on a horizontal plane, and implanting second conductive type impurities into the substrate with the tilt angle or another tilt angle to form another LDD structure symmetric to said LDD structure with respect to the gate structure, wherein at least some of the impurities implanted in this step are implanted into the substrate through the spacer to form another part of the LDD structure below the spacer layer.

7. The method of claim 6, wherein the rotation angle is 90 degree, 180 degree, or 270 degree.

8. The method of claim 1, wherein regions implanted by the step of forming the LDD structure and the step of forming the source and drain are defined by a same mask.

9. The method of claim 1, wherein the step of forming the LDD structure and the step of forming the source and drain are blanket implantations using the gate structure and the isolation regions as masks.

* * * * *